(12) United States Patent
Wu et al.

(10) Patent No.: US 9,437,649 B2
(45) Date of Patent: Sep. 6, 2016

(54) SEMICONDUCTOR STRUCTURE, METHOD FOR FORMING THE SAME AND METHOD FOR SUPPRESSING HOT CLUSTER

(71) Applicant: Himax Imaging, Inc., Grand Cayman (KY)

(72) Inventors: Yang Wu, Grand Cayman (KY); Feixia Yu, Grand Cayman (KY); Chung-Wei Chang, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 158 days.

(21) Appl. No.: 14/195,764

(22) Filed: Mar. 3, 2014

(65) Prior Publication Data

US 2014/0246713 A1     Sep. 4, 2014

(30) Foreign Application Priority Data

Mar. 4, 2013   (TW) .............................. 102107511 A

(51) Int. Cl.
*H01L 27/00*      (2006.01)
*H01L 27/146*     (2006.01)

(52) U.S. Cl.
CPC ..... *H01L 27/14687* (2013.01); *H01L 27/1463* (2013.01); *H01L 27/14645* (2013.01); *H01L 27/14689* (2013.01)

(58) Field of Classification Search
CPC ................. H01L 27/1463; H01L 27/14687; H01L 27/14645; H01L 27/14689
See application file for complete search history.

(56) References Cited

U.S. PATENT DOCUMENTS

2009/0294816 A1* 12/2009 Park .................. H01L 27/14603
257/292

FOREIGN PATENT DOCUMENTS

| TW | 200841464 | 10/2008 |
|---|---|---|
| TW | I336942 | 2/2011 |

* cited by examiner

*Primary Examiner* — Caleb Henry
*Assistant Examiner* — Alexander Belousov
(74) *Attorney, Agent, or Firm* — Winston Hsu; Scott Margo

(57) ABSTRACT

A semiconductor structure for suppressing hot clusters includes a substrate of a first dopant concentration, an epitaxial layer having a second dopant concentration smaller than the first dopant concentration and directly disposed on the substrate, a dopant gradient region disposed in the epitaxial layer and having a gradient decreasing from the substrate to the epitaxial layer, a shallow trench isolation disposed between a first element region and a second element region, and a shallow trench doping region surrounding the shallow trench isolation and near the dopant gradient region to suppress a hot cluster formed by the first element region to jeopardize the second element region.

4 Claims, 4 Drawing Sheets

SEMICONDUCTOR STRUCTURE, METHOD FOR FORMING THE SAME AND METHOD FOR SUPPRESSING HOT CLUSTER

CROSS REFERENCE TO RELATED APPLICATION

This application claims the benefit of Taiwanese Application 102107511, filed Mar. 4, 2013.

BACKGROUND OF THE INVENTION

1. Field of the Invention

The present invention generally relates to a method for forming a semiconductor structure to suppress a hot cluster, a method for suppressing a hot cluster and a semiconductor structure for suppressing a hot cluster. In particular, the present invention is directed to a semiconductor structure with a dopant gradient region of a constructed back diffusion type as well as an isolation doping region surrounding a shallow trench isolation so that in the resultant semiconductor structure a shallow trench isolation region is substantially adjacent to the dopant gradient region to suppress a possible hot cluster in the semiconductor structure.

2. Description of the Prior Art

A CMOS image sensor is widely used in many applications, such as a portable device, a web cam, a monitor, a toy or a medical instrument. Like any other successful consumer electronic product, a successful CMOS image sensor must have high sensitivity to gain the upwind side of the very competing market.

As far as the high sensitivity is concerned, one of the most critical questions is the failure owing to a hot cluster. A hot cluster failure is like a contagious disease, not only the functions of the original pixel are destroyed but also the neighboring pixels are also suffering collateral damages so that normal ones and abnormal ones together become bad ones. These bad pixels collectively form a cross shape cluster or a block shape cluster due to the hot cluster failure.

Since the current product standards are demandingly high, only one single hot cluster failure results in the total failure of the die, no matter how good the others are. The bottle neck to solve the hot cluster failure is: there may be various reasons from every manufacturing step and they are generally fab-related. So far the proposed ways to solve the hot cluster failure problems are still limited to case-by-case approaches. There is no universal and thorough solution available.

SUMMARY OF THE INVENTION

In the light of these, the present invention proposes a semiconductor structure for suppressing a hot cluster, a method for forming a semiconductor structure and a method for suppressing a hot cluster. The method of the present invention may make the behavior of an abnormal pixel locally restricted without spreading out to form a hot cluster. This may effectively solve the problem of the tendency of abnormal pixels to form a hot cluster and avoid the disaster of total failure of a die because of a single hot cluster.

The present invention in a first aspect proposes a method for forming a semiconductor structure to suppress a hot cluster. First, an epitaxial layer is formed on a substrate to directly contact the substrate. Second, a thermal step is carried out after the formation of the epitaxial layer to form a dopant gradient region in the epitaxial layer so that the dopant gradient region has a dopant gradient decreasing from the substrate toward the epitaxial layer. Then, at least one element step is carried out after the formation of the dopant gradient region to form a plurality of element regions disposed in the epitaxial layer. The element regions include a first element region, a second element region and a shallow trench isolation region disposed between the first element region and the second element region. The shallow trench isolation region includes a shallow trench isolation and an isolation doping region surrounding the shallow trench isolation so that the isolation doping region is substantially adjacent to the dopant gradient region.

In one embodiment of the present invention, the substrate, the epitaxial layer, and the isolation doping region have a first type conductivity, and the first element region and the second element region have a second type conductivity.

In another embodiment of the present invention, the substrate has a first dopant concentration greater than a second dopant concentration of the epitaxial layer.

In another embodiment of the present invention, the thermal step is carried out for a first time period and at a first temperature determined by a profile simulation.

In another embodiment of the present invention, a first element in the first element region and a second element in the second element region are respectively a CMOS image sensor (CIS).

In another embodiment of the present invention, the shallow trench isolation region and the dopant gradient region together form a potential barrier to suppress a hot cluster caused by a dark current travelling from the first element region through the epitaxial layer to the second element region.

In another embodiment of the present invention, the shallow trench isolation region substantially overlap the dopant gradient region to suppress a hot cluster caused by a dark current travelling from the first element region through the epitaxial layer to the second element region.

In another embodiment of the present invention, the shallow trench isolation region substantially overlaps the dopant gradient region to cut the dark current off.

In another embodiment of the present invention, a first element doping region and a second element doping region are respectively formed in the first element region and in the second element region. The shallow trench isolation region is closer to the dopant gradient region than at least one of the first element doping region and the second element doping region.

In another embodiment of the present invention, the dopant gradient region is a back diffusion region.

In another embodiment of the present invention, the at least one element step further includes an annealing procedure to adjust the dopant gradient.

The present invention in a second aspect proposes a semiconductor structure for suppressing a hot cluster. The semiconductor structure includes a substrate of a first dopant concentration, an epitaxial layer, a dopant gradient region, a first element region, a second element region and a shallow trench isolation region. The epitaxial layer is disposed on the substrate and directly contacts the substrate, and has a second dopant concentration smaller than the first dopant concentration. The dopant gradient region is disposed in the epitaxial layer and has a dopant gradient decreasing from the substrate to the epitaxial layer. The first element region is disposed in the epitaxial layer and includes a first element doping region and a first element. The second element region is disposed in the epitaxial layer and includes a second element doping region and a second element. The shallow trench isolation region is disposed between the first element region and the second element region, and includes an isolation doping region surrounding a shallow trench isolation. The shallow trench isolation region is substantially adjacent to the dopant gradient region to suppress a hot cluster formed by the first element region jeopardizing the second element region.

In one embodiment of the present invention, the first element and the second element are respectively a CMOS image sensor.

In another embodiment of the present invention, the shallow trench isolation region substantially overlaps the dopant gradient region to suppress a dark current travelling from the first element region through the epitaxial layer to the second element region.

In another embodiment of the present invention, the shallow trench isolation region is closer to the dopant gradient region than at least one of the first element region and the second element region.

The present invention in a third aspect proposes a method for suppressing a hot cluster. First, an epitaxial layer is formed on a substrate and directly contacts the substrate. The substrate has a first dopant concentration greater than a second dopant concentration of the epitaxial layer. Second, an element step including a thermal step is carried out to form a plurality of element regions disposed in the epitaxial layer. The element regions includes a first element region including a first element doping region and a first element, a second element region including a second element doping region and a second element as well as a shallow trench isolation region disposed between the first element region and the second element region. The shallow trench isolation region includes a shallow trench isolation and an isolation doping region surrounding the shallow trench isolation. The thermal step forms a dopant gradient region disposed between the substrate and the epitaxial layer and has a dopant gradient decreasing from the substrate toward the epitaxial layer. The dopant gradient makes the shallow trench isolation region substantially adjacent to the dopant gradient region suppress a hot cluster caused by the first element region disturbing the second element region.

In one embodiment of the present invention, the substrate, the epitaxial layer, and the shallow trench isolation region have a first type conductivity, and the first element region and the second element region have a second type conductivity, wherein the first type conductivity is P-type and the second type conductivity is N-type.

In another embodiment of the present invention, the first element and the second element are respectively a CMOS image sensor.

In another embodiment of the present invention, the shallow trench isolation region substantially overlap the dopant gradient region to suppress a dark current travelling from the first element region through the epitaxial layer to the second element region.

In another embodiment of the present invention, the shallow trench isolation region is closer to the dopant gradient region than at least one of the first element region and the second element region.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a method for forming a semiconductor structure to suppress a hot cluster and a resultant semiconductor structure for suppressing a hot cluster. Accordingly, the present invention further provides a method for suppressing a hot cluster. The method of the present invention may make the bad behaviors of an abnormal pixel locally restricted without spreading out to form a hot cluster. In such a way, the problem of the tendency of abnormal pixels to form a hot cluster may be effectively solved and the disaster of total failure of a die may be avoided because of a single hot cluster within.

In a first aspect, the present invention provides a method for forming a semiconductor structure to suppress a hot cluster. In such a way, it is a possible to suppress a hot cluster. FIG. 1 to FIG. 4 illustrates the steps for forming a semiconductor structure to suppress a hot cluster. First, please refer to FIG. 1, a substrate 101 is provided and an epitaxial layer 110 is formed on the substrate 101 to directly contact the substrate 101. The epitaxial layer 110 may be formed on the substrate 101 by conventional processes.

The substrate 101 may be a semiconductive material, such as Si, and has a dopant, such as a dopant of Group III or Group V, preferably a p-type dopant. However, by contrast with it, the epitaxial layer 110 is substantially free of a dopant, or the dopant concentration in the epitaxial layer 110 is by far less than that in the substrate 101 so there is a junction 111 between the epitaxial layer 110 and the substrate 101.

Figure 1:
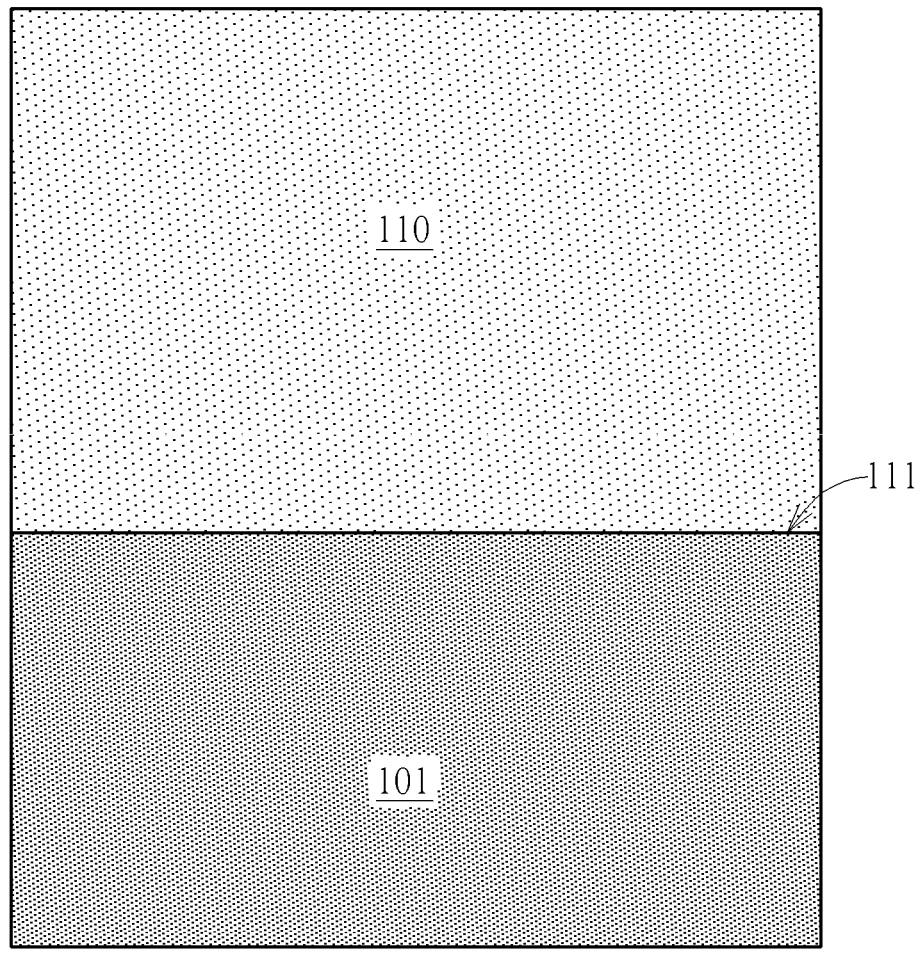
FIG. 1 to FIG. 3 illustrate a method for forming a semiconductor structure to suppress a hot cluster.
Figure 2:
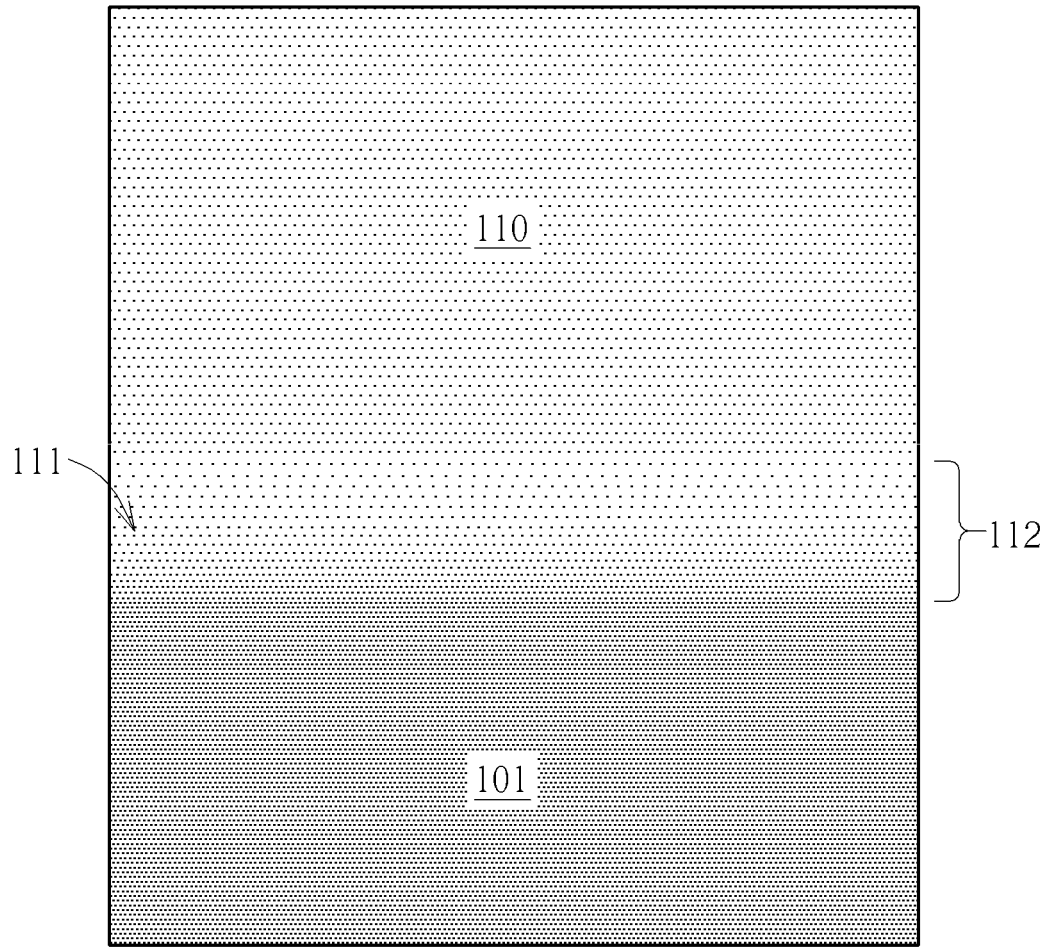

Second, as shown in FIG. 2, a thermal step is carried out after the formation of the epitaxial layer 110 to form a dopant gradient region 112, for example a back diffusion region, in the epitaxial layer 110 close to the junction 111. The recipe of the thermal step may be intentionally adjusted so that in one aspect the dopant gradient region 112 in the epitaxial layer 110 has a dopant gradient decreasing from the substrate 101 toward the epitaxial layer 110, and in another aspect the dopant gradient region 112 in the substrate 101 has a dopant gradient increasing from the junction 111 toward the substrate 101.

Preferably, it would not take long time to carry out the thermal step to avoid the damages of the doping well, to jeopardize the quantum yield and to cause problems such as cross talk. The thermal step is not only easy but also simple and compatible with the current semiconductor process without employing a custom-ordered wafer or substrate. The dopant gradient region 112 is able to construct a potential barrier between the epitaxial layer 110 and the substrate 101.

A simulation approach may be used to predict the profiles of the dopant gradient region 112. For example, various methods such as a model, a profile simulation or a device simulation may be optionally used to predict the profiles of the dopant gradient region 112. For instance, the thermal step may be carried out under a first temperature for a first time period which is suggested by the profile simulation.

Figure 3:
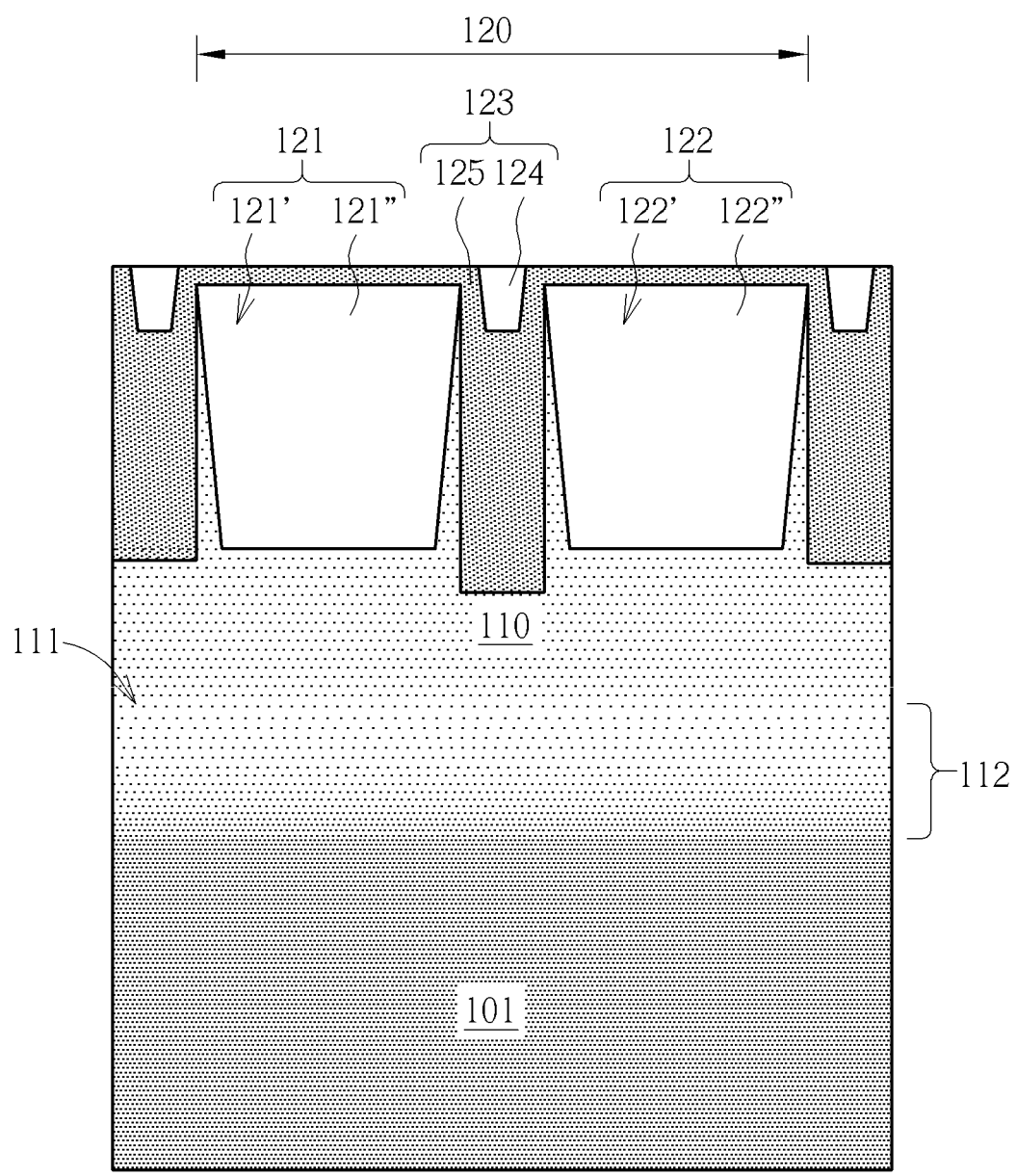

Then, as shown in FIG. 3, after the formation of the dopant gradient region 112 and after the completion of the thermal step, at least one element step is carried out in the epitaxial layer 110 to form multiple element regions 120, i.e. pixel regions, disposed in the epitaxial layer 110 at the same time or in a suitable order. The element regions 120 includes a first element region 121, a second element region 122 and a shallow trench isolation region 123 disposed between the first element region 121 and the second element region 122.

Figure 4:
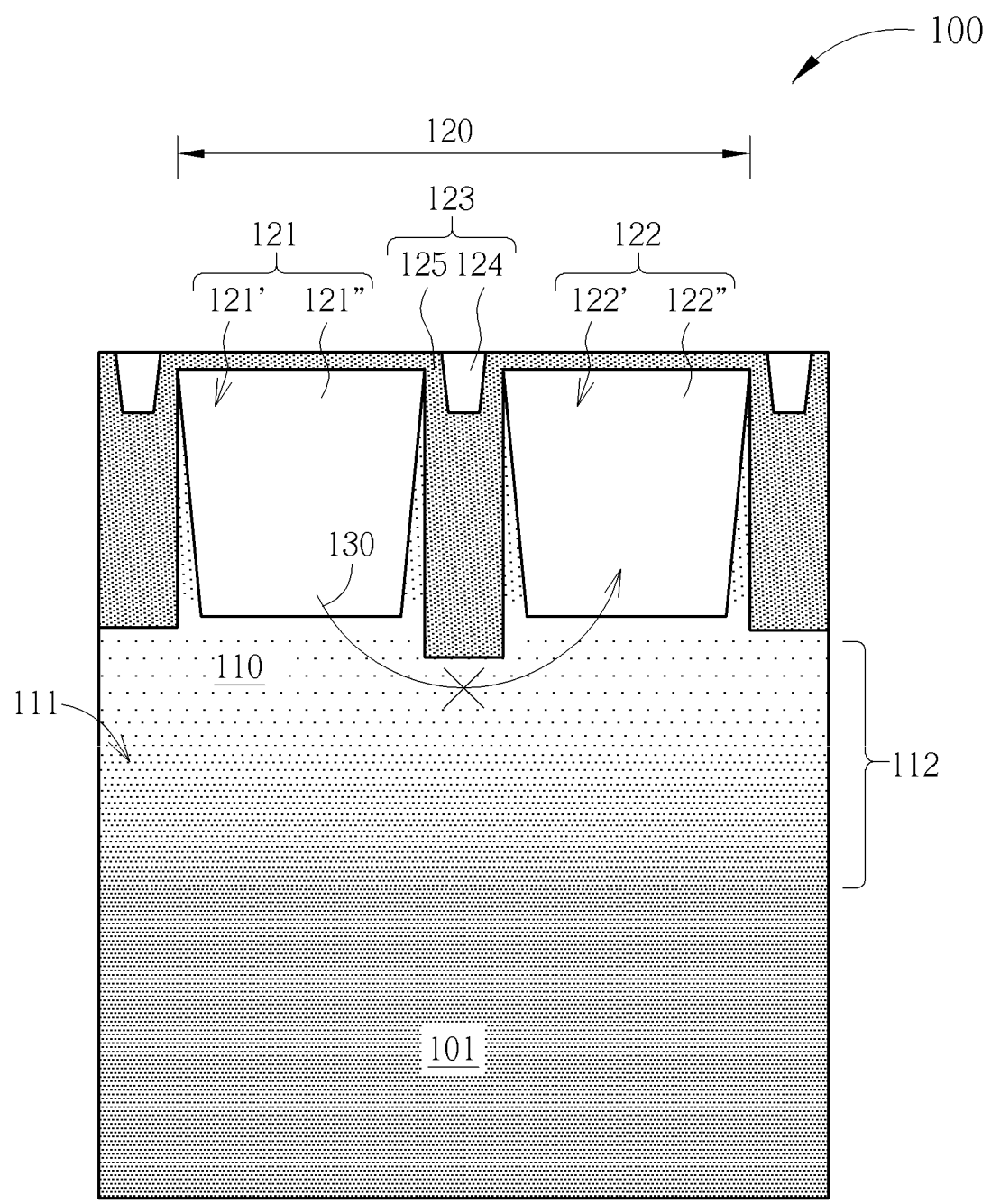
FIG. 4 illustrates a semiconductor structure for suppressing a hot cluster.

Optionally, the annealing procedure originally used in the element step may be used to adjust the dopant gradient or an additional annealing procedure may be introduced to adjust the dopant gradient, as shown in FIG. 4, to form an ideal back diffusion region 112. Optionally and additionally, there may be a first element doping region 121' and a second element doping region 122' respectively formed in the first element region 121 and the second element region 122.

A first element 121" in the first element region 121 and a second element 122" in the second element region 122 may be respectively a CIS. The shallow trench isolation region 123 may include a shallow trench isolation 124 and an isolation doping region 125 which surrounds the shallow trench isolation 124. In one embodiment of the present invention, the substrate 101, the epitaxial layer 110 and the isolation doping region 125 respectively have a first type conductivity, such as P-type, and the first element doping region 121' and the first element 121" in the first element region 121 or the second element 122" and the second element doping region 122' in the second element region 122 respectively have a second type conductivity, such as N-type.

The isolation doping region 125 not only completely surrounds the shallow trench isolation 124 but the isolation doping region 125 also deeply goes into the epitaxial layer 110 so that the isolation doping region 125 substantially approaches and is substantially adjacent to, namely as close to as possible, the dopant gradient region 112 and the junction 111. In one embodiment of the present invention, the doping conditions of the isolation doping region 125 in the shallow trench isolation region 123 may be well adjusted so that the shallow trench isolation region 123 is closer to the dopant gradient region 112 than at least one of the first element doping region 121' and the second element doping region 122' so as to form a concrete potential barrier. Preferably, the depth of at least one of the shallow trench isolation 124 and the isolation doping region 125 is deeper than that of at least one of the first element doping region 121' and the second element doping region 122'. In addition, the dopant type of the epitaxial layer 110 and the isolation doping region 125 may be the same, such as p-type, but the dopant concentration of the isolation doping region 125 is by far greater than that of the epitaxial layer 110.

Besides, the dopant gradient region 112 which is previously constructed in the above thermal step has a dopant gradient in the epitaxial layer to decrease from the substrate 101 toward the epitaxial layer 110. With the isolation doping region 125 in the shallow trench isolation region 123 and substantially adjacent to the dopant gradient region 112, both the isolation doping region 125 and the dopant gradient region 112 substantially enclose or surround each one of the element regions 121/122 by means of their sides and the bottom. The synergy of the two makes the dopant concentration of the epitaxial layer 110 between two adjacent first element region 121 and second element region 122 high enough minimize the part which can be used by a dark current, in other words, construct a sufficient potential barrier. The result makes a possible electronic flow 130 in any one of the first element region 121 and the second element region 122 almost impossible go over the potential barrier to adversely influence, i.e. disturbing, neighboring other element regions.

For example, the potential barrier is able to effectively suppress a dark current 130 travelling from the first element region 121 through the epitaxial layer 110 to the second element region 122 as well as a hot cluster caused by such dark current 130. In such a way, the above-mentioned method for forming a semiconductor structure is able to resultantly suppress a hot cluster effectively. Preferably, the shallow trench isolation region 123 may substantially, i.e. able to achieve the following result, overlap the dopant gradient region 112 to facilitate the suppression of, or further substantially, i.e. ably, to block or to cut off the dark current 130 travelling from the first element region 121 through the epitaxial layer 110 to the second element region 122 as well as a hot cluster caused by such dark current 130.

In the light of the above method, a resultant semiconductor structure to suppress a hot cluster is obtained. The present invention in a second aspect provides such a semiconductor structure to suppress a hot cluster. The semiconductor structure 100 to suppress a hot cluster, as shown in FIG. 4, includes a substrate 101, an epitaxial layer 110, a dopant gradient region 112, a first element region 121, a second element region 122 and a shallow trench isolation region 123. The substrate 101 may be a semiconductive material, such as Si, and has a first dopant concentration. The epitaxial layer 110 is disposed on the substrate 101 and directly contacts the substrate 101. The epitaxial layer 110 has a second dopant concentration which is smaller than the first dopant concentration.

The dopant gradient region 112 is disposed in the epitaxial layer 110 and may be a back diffusion region so it may preferably have a dopant gradient decreasing from the substrate 101 to the epitaxial layer 110. In particular, the back diffusion region may preferably form a potential barrier between the epitaxial layer 110 and the substrate 101.

The first element region 121 is disposed in the multiple element regions 120, i.e. pixel regions, of the epitaxial layer 110 and includes a first element doping region 121' and a first element 121". The second element region 122 is also disposed in the multiple element regions 120, i.e. pixel regions, of the epitaxial layer 110, adjacent to the first element region 121 and includes a second element doping region 122' and a second element 122". The first element 121" in the first element region 121 and a second element 122" in the second element region 122 may be respectively a CIS.

The shallow trench isolation region 123 is disposed between the first element region 121 and the second element region 122 and includes a shallow trench isolation 124 and an isolation doping region 125 which surrounds the shallow trench isolation 124. In one embodiment of the present invention, the shallow trench isolation region 123 is closer to the dopant gradient region 112 than at least one of the first element doping region 121' and the second element doping region 122', and preferably, the depth of at least one of the shallow trench isolation 124 and the isolation doping region 125 is greater than that of the first element doping region 121' and the second element doping region 122' and makes at least one of them closer to the dopant gradient region 112 so as to form a more concrete potential barrier.

The location of the isolation doping region 125 is in fact close to the dopant gradient region 112 so the dopant gradient region 112 along with the shallow trench isolation region 123 is able to suppress a hot cluster which is caused by the adverse influence, for example disturbing or jeopardizing, of the first element region 121 on the second element region 122. Preferably, the shallow trench isolation region 123 may substantially, i.e. is able to achieve the following result, overlap the second element region 122 to make both the isolation doping region 125 and the dopant gradient region 112 substantially enclose or surround each one of the element regions 121/122 by means of their sides and the bottom, to further facilitate the suppression of, or further substantially, i.e. ably, to block or to cut off the dark current 130 travelling from the first element region 121 through the epitaxial layer 110 to the second element region 122 as well as a hot cluster caused by such dark current 130.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure for suppressing a hot cluster, comprising:
   a substrate of a first dopant concentration;
   an epitaxial layer disposed on and directly contacting said substrate, and having a second dopant concentration smaller than said first dopant concentration;
   a dopant gradient region disposed in said epitaxial layer and having a dopant gradient decreasing from said substrate to said epitaxial layer;
   a first element region disposed in said epitaxial layer and comprising a first element doping region and a first element;
   a second element region disposed in said epitaxial layer and comprising a second element doping region and a second element; and
   a shallow trench isolation region disposed between said first element region and said second element region, and comprising a shallow trench isolation completely disposed inside said shallow trench isolation region, wherein said shallow trench isolation region is substantially adjacent to said dopant gradient region to suppress a hot cluster formed by said first element region jeopardizing said second element region.

2. The semiconductor structure for suppressing a hot cluster of claim 1, wherein said first element and said second element are respectively a CMOS image sensor.

3. The semiconductor structure for suppressing a hot cluster of claim 2, wherein said shallow trench isolation region substantially overlap said dopant gradient region to suppress a dark current travelling from said first element region through said epitaxial layer to said second element region.

4. The semiconductor structure for suppressing a hot cluster of claim 1, wherein said shallow trench isolation region is closer to said dopant gradient region than at least one of said first element region and said second element region.

* * * * *